(12) United States Patent
Hirai et al.

(10) Patent No.: US 7,109,643 B2
(45) Date of Patent: Sep. 19, 2006

(54) ACTUATOR

(75) Inventors: Toshihiro Hirai, Ueda (JP); Morinobu Endo, Suzaka (JP)

(73) Assignee: Japan as represented by the Director General of Agency of Shinshu University, Nagano (JP)

(*) Notice: Subject to any disclaimer, the term of this patent is extended or adjusted under 35 U.S.C. 154(b) by 152 days.

(21) Appl. No.: 10/816,875

(22) Filed: Apr. 5, 2004

(65) Prior Publication Data
US 2005/0168113 A1    Aug. 4, 2005

(30) Foreign Application Priority Data
Feb. 3, 2004    (JP)    ............... 2004-027336

(51) Int. Cl.
*H01L 41/047* (2006.01)
(52) U.S. Cl. .................................... 310/363
(58) Field of Classification Search ................ 310/363, 310/365; 29/25.35
See application file for complete search history.

(56) References Cited

U.S. PATENT DOCUMENTS

| | | | |
|---|---|---|---|
| 6,338,547 B1* | 1/2002 | Silverbrook | ................. 347/54 |
| 2002/0050769 A1* | 5/2002 | Pelrine et al. | ............. 313/363 |
| 2002/0130673 A1* | 9/2002 | Pelrine et al. | ............. 324/727 |

FOREIGN PATENT DOCUMENTS

| | | |
|---|---|---|
| JP | 07-240544 A | 9/1995 |
| JP | 10-321482 | * 12/1998 |
| JP | 2000-049397 A | 2/2000 |

* cited by examiner

*Primary Examiner*—Thomas M. Dougherty
(74) *Attorney, Agent, or Firm*—Birch, Stewart, Kolasch & Birch, LLP

(57) ABSTRACT

The actuator is capable of greatly deforming a flexible sheet member. The actuator comprises: a flexible sheet member being made of a polymer material; and a pair of electrodes being respectively provided on both faces of the sheet member, the electrodes being made of carbon nano fibers.

14 Claims, 9 Drawing Sheets

APPLIED VOLTAGE 100V

APPLIED VOLTAGE 150V

APPLIED VOLTAGE 200V

APPLIED VOLTAGE 300V

APPLIED VOLTAGE 400V

APPLIED VOLTAGE 500V

APPLIED VOLTAGE 600V

APPLIED VOLTAGE 700V

APPLIED VOLTAGE 800V

APPLIED VOLTAGE 900V

APPLIED VOLTAGE 800V

APPLIED VOLTAGE 800V

APPLIED VOLTAGE 800V

APPLIED VOLTAGE 800V

APPLIED VOLTAGE 800V

ACTUATOR

This Nonprovisional application claims priority under 35 U.S.C. §119(a) on Patent Application No(s). 2004-27336 filed in Japan on Feb. 3, 2004, the entire contents of which are hereby incorporated by reference.

BACKGROUND OF THE INVENTION

1. Field of the Invention

The present invention relates to an actuator and a material for electrodes of the actuator, more precisely relates to an actuator capable of greatly deforming a sheet member made of a polymer material by applying an electric field and a material for electrodes of the actuator.

2. Description of the Related Art

An actuator having a flexible sheet member made of a polymer material and a pair of electrodes respectively provided on both faces of said sheet member has been known. The sheet member is deformed by applying an electric field.

For example, a conventional actuator is disclosed in Japanese Patent Gazette No. 2000-49397. The actuator is shown in FIG. 17. The actuator 10 has a one-layer polyurethane film 12 and a pair of electrodes 11 respectively provided on both faces of the polyurethane film 12. Deformation (bending electrostriction) is occurred by applying an electric field to the actuator 10. The electrodes 11 are formed on the both faces of the polyurethane film 12 by evaporating gold.

When the electrodes 11 are formed by evaporating gold, fine particles of gold are stuck onto surfaces of the polyurethane film 12.

By applying the electric field to the actuator 10, the actuator 10 bends as shown in FIG. 18. Therefore, the actuator 10 can be used to actuate other members. By employing the bending action, various kinds of actuators can be realized.

However, the deformation is so small, e.g., curvature $1/R=36$ m$^{-1}$ (see the Japanese patent gazette), that usage of the actuator must be much limited.

The inventors of the present invention studied and found that the deformation of the actuator was limited by a structure of the electrodes 11.

Namely, the electrodes 11 are formed by evaporating gold, so the fine particles of gold are stuck on the polyurethane film 12 by evaporation and keep contact each other. When the actuator 10 having such electrodes 11 is deformed, the electrodes 11 are cracked so that electric conduction is stopped. Therefore, the actuator 10 cannot be greatly deformed itself. If the electrodes 11 are made thick so as not to be cracked, the polyurethane film 12 cannot bend.

SUMMARY OF THE INVENTION

An object of the present invention is to provide an actuator capable of greatly bending a flexible sheet member.

Another object of the present invention is to provide a material for electrodes of the actuator of the present invention.

To achieve the objects, the present invention has following structures.

Namely, the actuator of the present invention comprises:

a flexible sheet member being made of a polymer material; and a pair of electrodes being respectively provided on both faces of the sheet member, the electrodes being made of carbon nano fibers.

In the actuator, one end of the carbon nano fibers constituting the electrodes may bite into the sheet member.

In the actuator, the polymer material may be, for example, polyurethane resin, silicone resin, etc.

The material for electrodes of the actuator is made of carbon nano fibers.

In the present invention, the electrodes are made of carbon nano fibers, which are merely contact each other, so that the electrodes can be flexible and can fully follow deformation of the sheet member with maintaining mutual contact. Therefore, the actuator can maximally deform the sheet member.

BRIEF DESCRIPTION OF THE DRAWINGS

Embodiments of the present invention will now be described by way of examples and with reference to the accompanying drawings, in which.

DETAILED DESCRIPTION OF THE EMBODIMENTS

Preferred embodiments of the present invention will now be described in detail with reference to the accompanying drawings.

Figure 1:
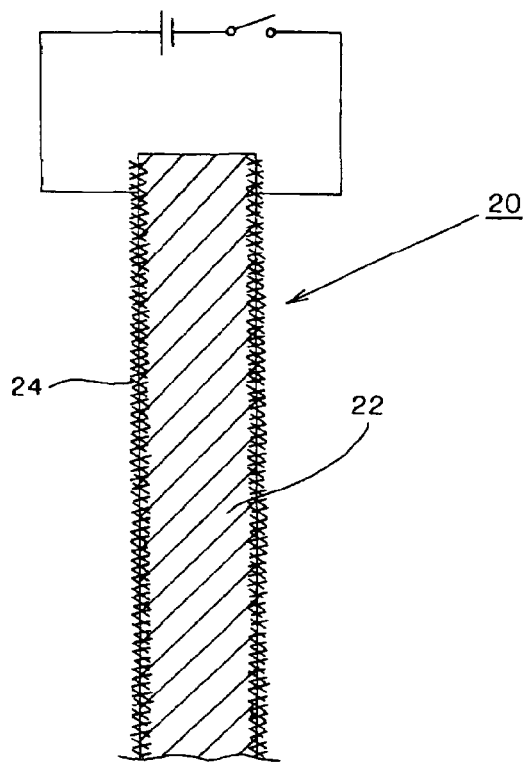
FIG. 1 is an explanation view showing a schematic structure of an actuator of the present invention.
Figure 2:
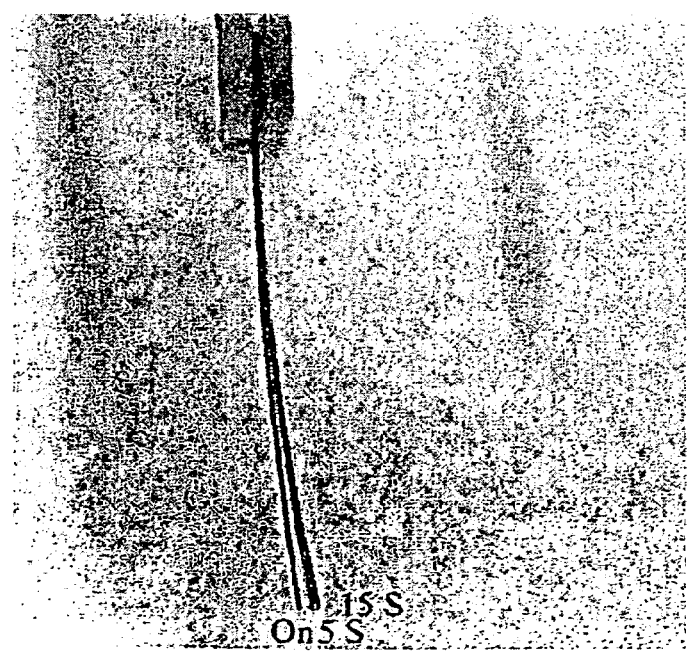
FIG. 2 is an explanation view on the basis of video images showing deformation of the actuator having a polyurethane sheet member, wherein 100 V is inputted to the actuator.
Figure 3:
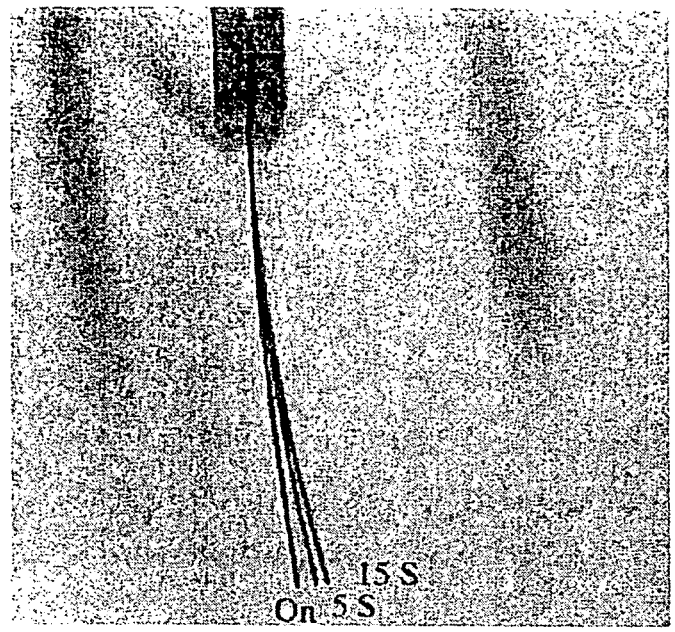
FIG. 3 is an explanation view on the basis of video images showing deformation of the actuator having the polyurethane sheet member, wherein 150 V is inputted to the actuator.
Figure 4:
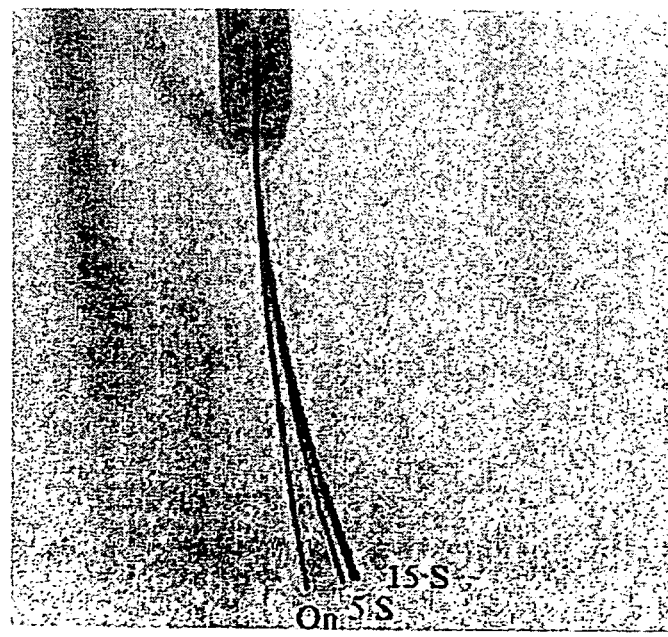
FIG. 4 is an explanation view on the basis of video images showing deformation of the actuator having the polyurethane sheet member, wherein 200 V is inputted to the actuator.
Figure 5:
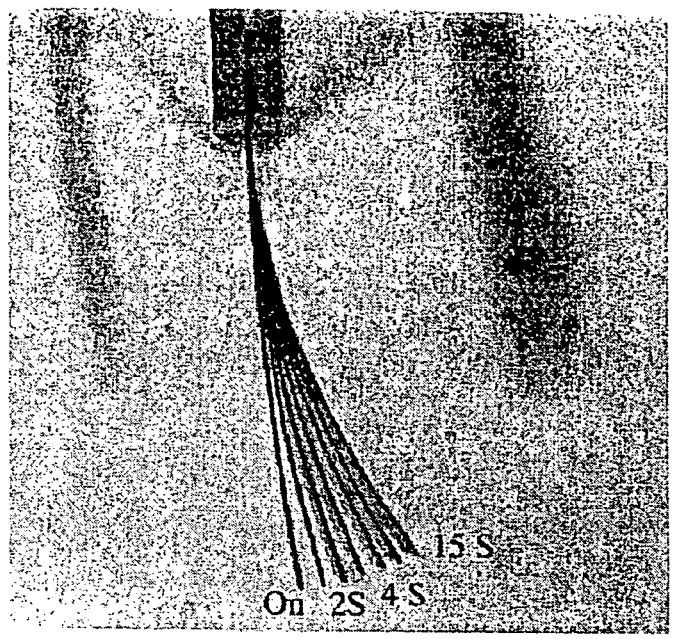
FIG. 5 is an explanation view on the basis of video images showing deformation of the actuator having the polyurethane sheet member, wherein 300 V is inputted to the actuator.
Figure 6:
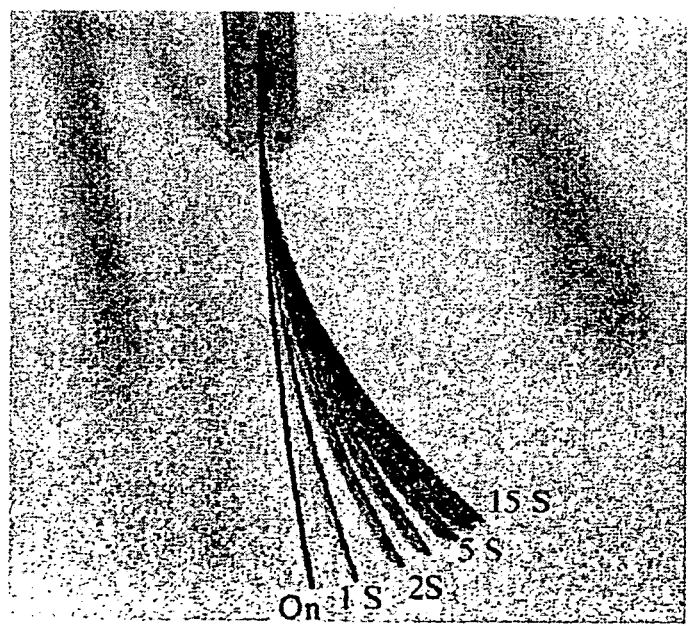
FIG. 6 is an explanation view on the basis of video images showing deformation of the actuator having the polyurethane sheet member, wherein 400 V is inputted to the actuator.
Figure 7:
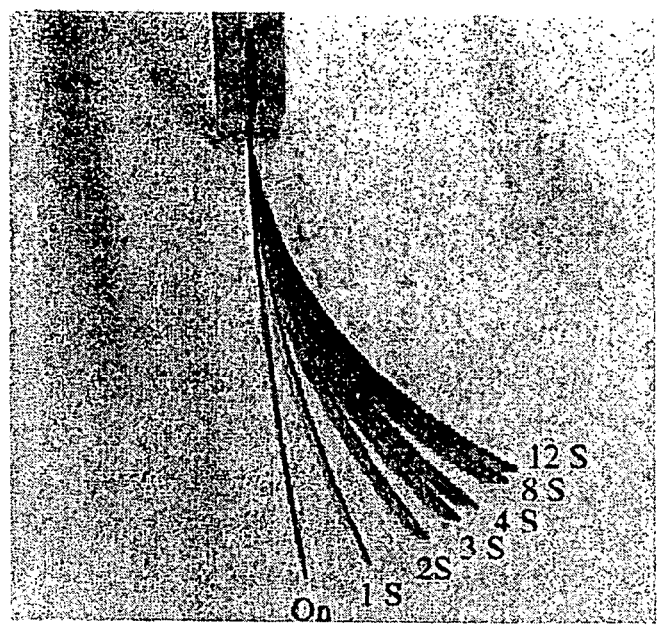
FIG. 7 is an explanation view on the basis of video images showing deformation of the actuator having the polyurethane sheet member, wherein 500 V is inputted to the actuator.
Figure 8:
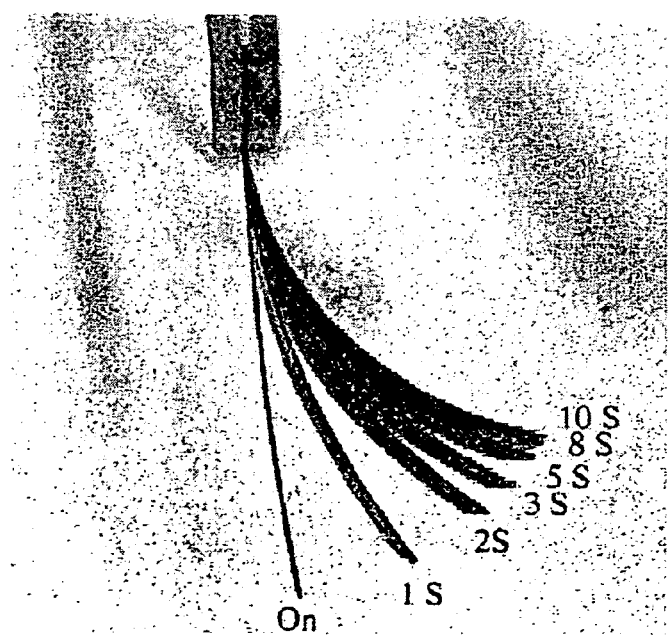
FIG. 8 is an explanation view on the basis of video images showing deformation of the actuator having the polyurethane sheet member, wherein 600 V is inputted to the actuator.
Figure 9:
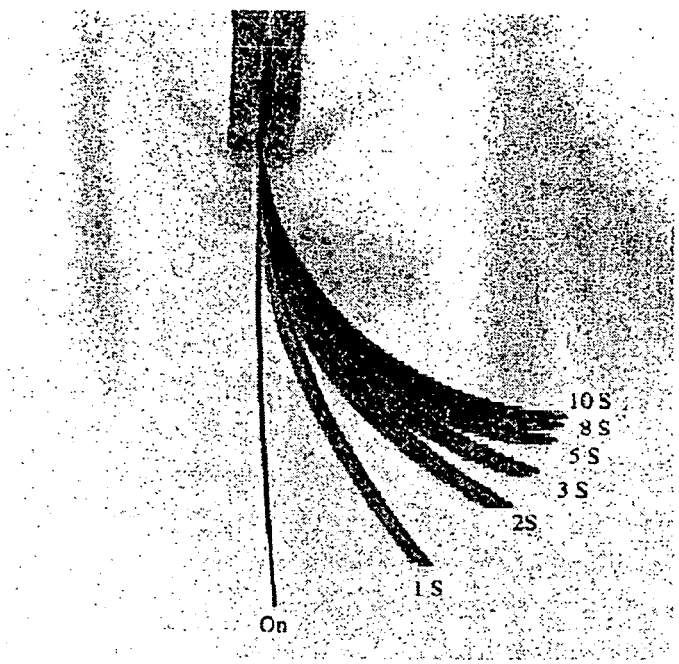
FIG. 9 is an explanation view on the basis of video images showing deformation of the actuator having the polyurethane sheet member, wherein 700 V is inputted to the actuator.
Figure 10:
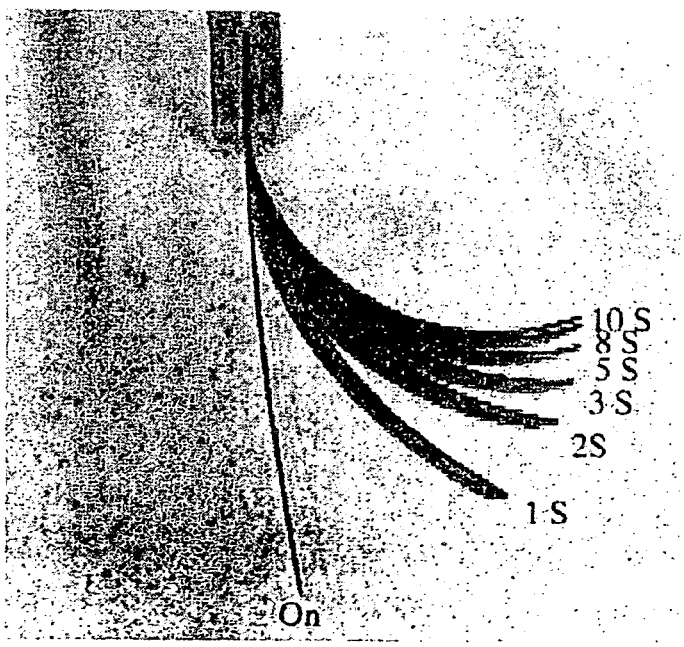
FIG. 10 is an explanation view on the basis of video images showing deformation of the actuator having the polyurethane sheet member, wherein 800 V is inputted to the actuator.

An actuator of the present embodiment is shown in FIG. 1.

The actuator 20 has a sheet member 22 made of a flexible polymer material. A pair of electrodes 24, which are mainly made of carbon nano fibers, are respectively provided on the both side faces of the sheet member 22.

The electrodes 24 may be formed to cover the whole side faces of the sheet member 22 or formed into prescribed patterns.

In FIG. 1, the electrodes 24 are formed to cover the whole side faces of the sheet member 22 with uniform thickness. By applying an electric field from one end to another electrode 24, the sheet member 22 is greatly bended. If the electrodes 24 are patterned, the sheet member 22 can be optionally deformed.

The polymer material of the sheet member 22 is not limited. For example, polyurethane, especially polyurethane whose soft segment includes polyester may be employed (see Japanese Patent Gazette 2000-49397).

Further, silicone gel, poly vinyl chloride, polyethylene, polypropylene, PET, etc. may be employed as the polymer material.

Conventionally, in the actuator which is deformed by applying an electric field, a material, whose molecules are oriented by a DC electric field, e.g., polyurethane elastomer having polycarbonate polyol, is employed as the polymer material (see Japanese Patent Gazette No. 7-240544).

However, in the present embodiment, the improved electrodes 24 can greatly deform so polymer materials, whose crystals have no orientation, can be employed.

Note that, a plasticizer may be added to the polymer so as to make a flexible polymer material.

Preferably, a little electrolyte, e.g., salt, is doped to the polymer material. By adding the electrolyte, an electric current of nA level can pass through the polymer material when the electric field is applied. Namely, the polymer material may have electroconductivity, which is as small as that of a semiconductor. Even in a polymer material having perfect insulativity, e.g., silicone gel, by doping the electrolyte, the material can be relatively greatly deformed when the electric field is applied.

A material of the electrodes 24 is carbon nano fibers. For example, carbon nano tubes, which are formed by a vapor growth process, may be employed as the carbon nano fibers. The carbon nano fibers formed by the vapor growth process are very fine fibers having diameter of dozens nm to one hundred and dozens nm and length of less than 20 um.

Preferably, the material of the electrodes 24 is constituted by carbon nano fibers only. But carbon components, e.g., graphite, carbon, may be added to the carbon nano fibers.

The electrodes 24, which is formed by the material mainly made of carbon nano fibers, are respectively provided on the both side faces of the sheet member 22, which is made of the flexible polymer material.

Methods of forming the electrodes 24 will be explained.

Firstly, a first method will be explained. Carbon nano fibers are dispersed in a solvent, e.g., ethanol, to form into paste. The paste is applied on the both side faces of the sheet member 22 and dried. The dried carbon nano fiber layers become the electrodes 24. Then, surfaces of the electrodes 24 are pressed by pressing means, e.g., a roller, so as to completely adhere the electrodes 24 on the side faces of the sheet member 22. By pressing the electrode 24, one end of the carbon nano fibers bite into the side faces of the sheet member 22.

Note that, the carbon nano fibers may be coated with layers of electroconductive resin so as to prevent the carbon nano fibers from falling off.

As described above, the carbon nano fibers are very fine fibers, and the electrodes 24 are made of many carbon nano fibers. Unlike the conventional electrode made of fine particles of gold, even if the sheet member 22 is greatly deformed, the flexible carbon nano fibers constituting the electrodes 24 can follow the deformation of the sheet member 22 without separating each other. Namely, the mutual contact of the carbon nano fibers can be maintained while the electrodes 24 follow the deformation of the sheet member 22.

Since the electrodes 24 are not cracked and broken even if the sheet member 22 is greatly deformed, function of the electrodes 24 can be maintained. Therefore, the sheet member 22 can be greatly deformed. Note that, the sheet member 22 is originally greatly deformable.

In the present embodiment, the electrodes 24 are made of the flexible carbon nano fibers, which are capable of following the deformation of the sheet member 22 with maintaining their mutual contact, the sheet member 24 can be maximally deformed.

As described above, one end of the carbon nano fibers can bite into the side faces of the sheet member 22 by pressing the electrodes 24 with, for example, the roller.

The inventors think that the ends of the carbon nano fibers biting into the sheet member 22 emit electrons when the electric field is applied to the electrodes 24.

Carbon fibers formed by the vapor growth process have been used as fibers for a field electron emitter. Electrons are emitted from sharp ends of the carbon fibers when a high electric field is applied.

The inventors found that electrons concentratedly emitted from the ends of the carbon nano fibers toward an inner solid or gel part of the sheet member 22 when the electric field is applied to the electrodes 24. With this action, the sheet member 22 can be effectively deformed or bended.

The inventors think that electric charges asymmetrically exist in both edge parts of the sheet member 22, so that one edge part is contracted and the other edge part is extended. Therefore, the polymer material of the sheet member 22 is bended.

As described above, the ends of the carbon nano fibers bite into the sheet member 22, and electrons are emitted from the ends toward the inner part of the sheet member 22. With this action, electric charges can be effectively charged, so that the asymmetrical existence of electric charges can be promoted. Therefore, the sheet member 22 can be deformed with high responsibility.

The electrodes 24 may be made of powderlike material (aggregated) too. In this case, the electrodes 24 are formed by uniformly scattering the powders onto the side faces of the sheet member 22 and pressing the powders with, for example, a roller. For example, silicone gel has viscous surfaces, the powders can be adhered on the side faces of the sheet member 22 made of the silicone gel so that the electrodes 24 can be formed. If the electrodes 24 are pressed, ends of the carbon nano fibers can bite into the side faces of the sheet member 22.

Successively, a second method of forming the electrodes 24 will be explained.

Powders of a material (carbon nano fibers) are uniformly scattered on a flat steel plate. Then, an electric field is applied to the steel plate. By applying the electric field, the carbon nano fibers stands up. In this state, silicone gel is fed on the upper face of the steel plate and solidified, so that a flexible sub-sheet member having an electrode can be formed on the steel plate. The sub-sheet member having the electrode is peeled from the steel plate. Further, another sub-sheet member having an electrode is formed on another steel plate by the same manner. Rear faces of the two sub-sheet members, on which no electrodes are formed, are mutually adhered, so that the actuator 20 having the flexible sheet member and a pair of the electrodes can be formed.

In the both processes, the electrodes can be formed much easier than the conventional electrodes, which are formed by evaporating gold.

Thickness of the electrodes 24 are not limited. As described above, the carbon nano fibers are gathered and contact each other, so that mutual contact of the carbon nano fibers can be maintained even if the sheet member 22 is deformed. As far as the carbon nano fibers contact each other, the sheet member 22 is made thinner so as to give higher flexibility. Further, the thin actuator 20 can reduces manufacturing cost.

The thin actuator may be transparent or semitransparent, so they can be used as actuators of many kinds of optical apparatuses.

Examples of the actuator will be explained.

EXAMPLE 1

Example 1 is respectively shown in FIGS. 2–11. FIGS. 2–11 are explanation views on the basis of video images showing the deformation of the actuators. In each example, the flexible sheet member was a polyurethane sheet (width 5 mm, length 20 mm and thickness 0.20 mm), to which sodium acetate was doped. The electrodes were made of carbon nano tubes and formed by the first method. Applied voltage was 100–900 V (0.5–4.5 MV/m).

When the electric field was applied to one end of each actuator, the actuator immediately slightly deforms (see a symbol "On" in each drawing). By increasing the applied voltage, rate of the deformation was accelerated, and degree of the deformation was increased. Note that, in the drawings, symbols "5S" indicate the deformation of the actuators when five seconds elapsed from applying voltage, and symbols "15S" indicate the deformation of the actuators when fifteen seconds elapsed from applied voltage.

As clearly shown in FIGS. 2–11, the sheet members, in each of which the electrodes were formed on the both side faces, were bended like arcs.

Figure 11:
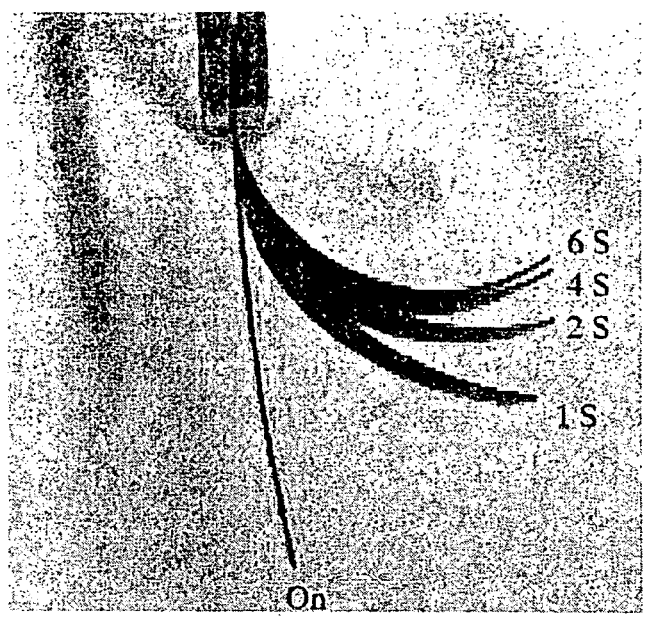
FIG. 11 is an explanation view on the basis of video images showing deformation of the actuator having the polyurethane sheet member, wherein 900 V is inputted to the actuator.

In FIG. 11, 900 V is applied to the electrodes. Curvature of the maximum deformation 1/R was about 100 $m^{-1}$ (a radius of curvature was about 10 mm). Therefore, a great deformation was attained.

EXAMPLE 2

Figure 12:
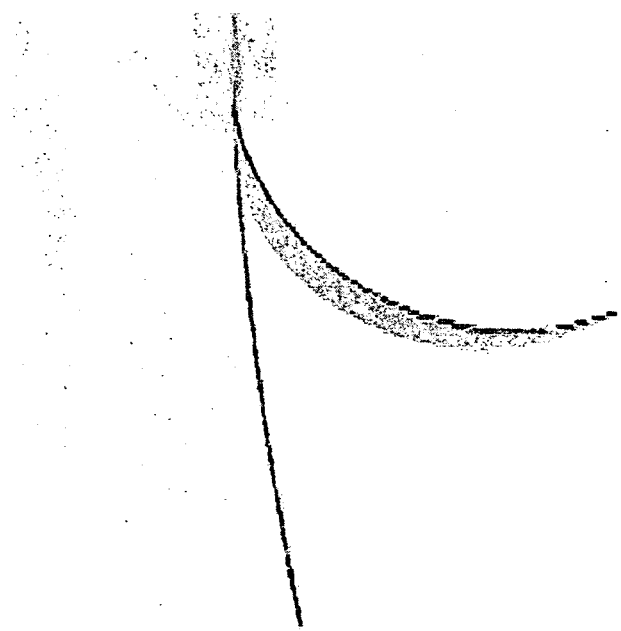
FIG. 12 is an explanation view on the basis of video images showing deformation of the actuator having the polyurethane sheet member including electrolyte, wherein 800 V is inputted to the actuator whose electrodes are made of carbon nano fibers.

Example 2 is shown in FIG. 12. FIG. 12 is an explanation view on the basis of video images showing the deformation of the actuator. In this example, the flexible sheet member was a polyurethane sheet (width 5 mm, length 20 mm and thickness 0.20 mm), to which sodium acetate was doped. The electrodes were made of carbon nano tubes. Applied voltage was 800 V (4 MV/m). FIG. 12 shows deformation of the actuator immediately after inputting voltage and that after several seconds elapsed from applying voltage.

Figure 13:
FIG. 13 is an explanation view on the basis of video images showing deformation of the actuator having the polyurethane sheet member including electrolyte, wherein 800 V is inputted to the actuator whose electrodes are made of polypyrrole.

A comparative example with respect to the Example 2 is shown in FIG. 13. FIG. 13 is an explanation view on the basis of video images showing the deformation of the actuator. In this comparative example, the flexible sheet member was a polyurethane sheet (width 5 mm, length 20 mm and thickness 0.20 mm), to which sodium acetate was doped. The electrodes were made of polypyrrole. Applied voltage was 800 V (4 MV/m). FIG. 13 shows deformation of the actuator immediately after applying voltage and that after several seconds elapsed from applying voltage.

According to FIGS. 12 and 13, the deformation of the actuator, whose electrodes were made of carbon nano fibers, was much greater than that of the actuator, whose electrodes were made of polypyrrole.

EXAMPLE 3

Figure 14:
FIG. 14 is an explanation view on the basis of video images showing deformation of the actuator having the polyurethane sheet member including no electrolyte, wherein 800 V is inputted to the actuator whose electrodes are made of carbon nano fibers.

Example 3 is shown in FIG. 14. FIG. 14 is an explanation view on the basis of video images showing the deformation of the actuator. In this example, the flexible sheet member was a polyurethane sheet (width 5 mm, length 20 mm and thickness 0.20 mm), to which no electrolyte was doped. The electrodes were made of carbon nano tubes. Applied voltage was 800 V (4 MV/m). FIG. 14 shows deformation of the actuator immediately after applying voltage and that after several seconds elapsed from applying voltage.

Figure 15:
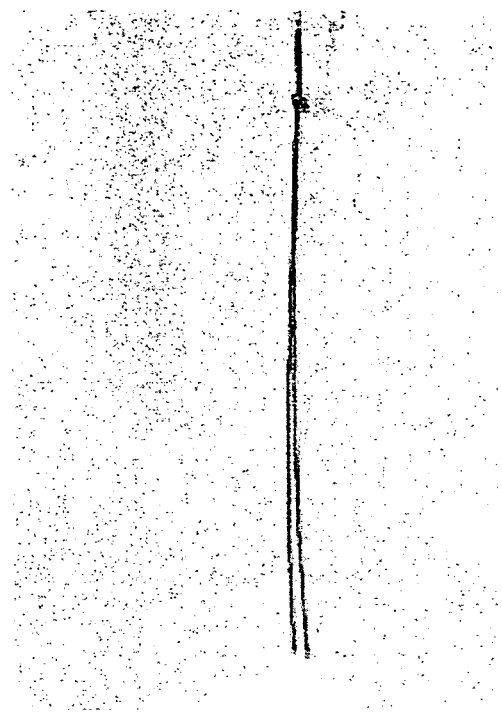
FIG. 15 is an explanation view on the basis of video images showing deformation of the actuator having the polyurethane sheet member including no electrolyte, wherein 800 V is inputted to the actuator whose electrodes are made of polypyrrole.

A comparative example with respect to the Example 3 is shown in FIG. 15. FIG. 15 is an explanation view on the basis of video images showing the deformation of the actuator. In this comparative example, the flexible sheet member was a polyurethane sheet (width 5 mm, length 20 mm and thickness 0.20 mm), to which no electrolyte was doped. The electrodes were made of polypyrrole. Applied voltage was 800 V (4 MV/m). FIG. 13 shows deformation of the actuator immediately after applying voltage and that after several seconds elapsed from applying voltage.

According to FIGS. 14 and 15, the deformation of the actuator, whose electrodes were made of carbon nano fibers, was much greater than that of the actuator, whose electrodes were made of polypyrrole. However, the deformation of the actuators shown in FIGS. 12 and 13 were greater than those shown in FIGS. 14 and 15 due to the electrolytes.

EXAMPLE 4

Figure 16:
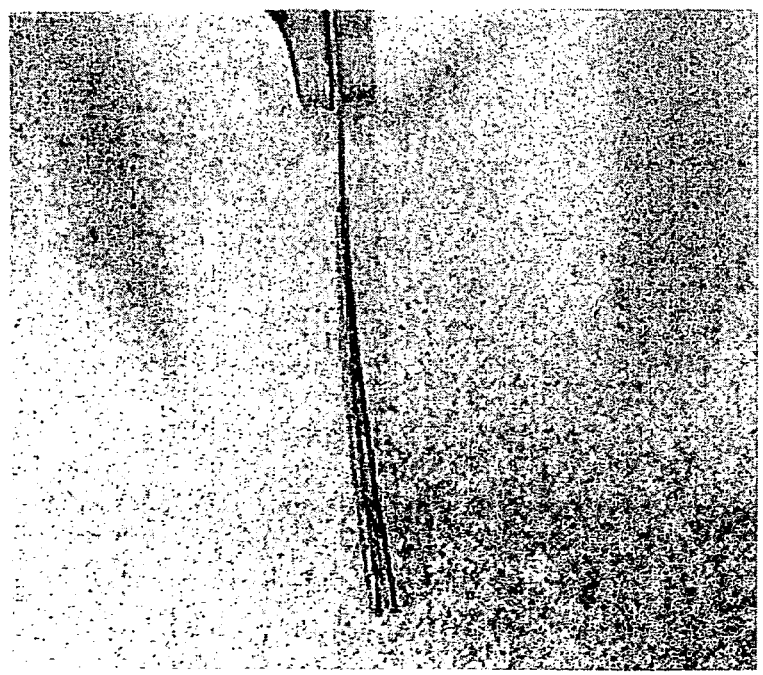
FIG. 16 is an explanation view on the basis of video images showing deformation of the actuator having a silicone film, wherein 800 V is inputted to the actuator.
Figure 17:
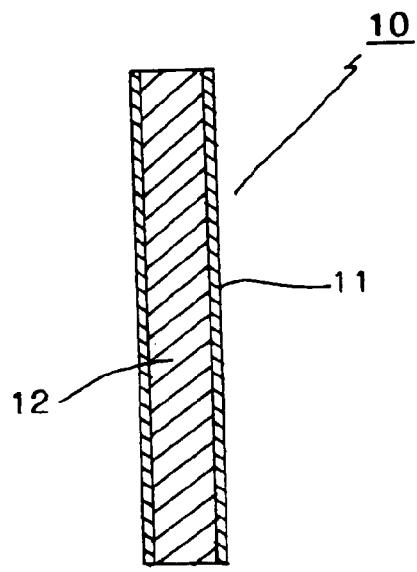
FIG. 17 is an explanation view showing the structure of the conventional actuator.
Figure 18:
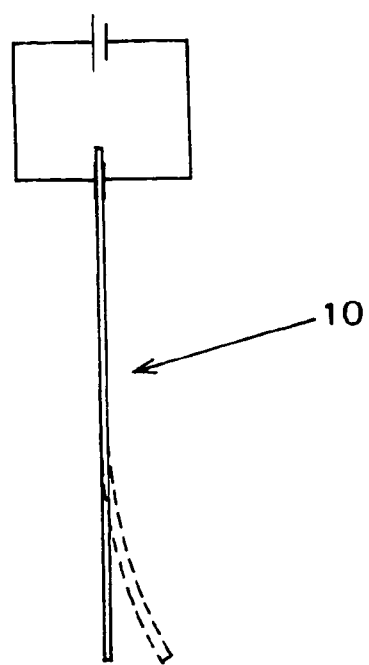
FIG. 18 is an explanation view showing the deformation of the conventional actuator.

Example 4 is shown in FIG. 16. FIG. 16 is an explanation view on the basis of video images showing the deformation of the actuator. In this example, the flexible sheet member was a silicone sheet (width 5 mm, length 20 mm and thickness 0.20 mm), to which sodium acetate was doped. The electrodes were made of carbon nano tubes. Applied voltage was 800 V (4 MV/m). FIG. 14 shows deformation of the actuator immediately after applying voltage and that after several seconds elapsed from applying voltage.

In the conventional actuator using a silicone sheet, no deformation was visually observed. By doping sodium acetate and employing the electrodes made of carbon nano tubes, the deformation of the actuator was clearly observed.

The actuator of the present invention uses the deformation of the flexible sheet member, so it cannot be used as a large power actuator. But the actuator can be effectively used for a switch of a minute electric device, an angle-changing mechanism of a reflection mirror, etc.

The invention may be embodied in other specific forms without departing from the spirit or essential characteristics thereof. The present embodiments are therefore to be considered in all respects as illustrative and not restrictive, the scope of the invention being indicated by the appended claims rather than by he foregoing description and all changes which come within the meaning and range of equivalency of the claims are therefore intended to be embraced therein.

What is claimed is:

1. An actuator, comprising:
   a flexible sheet member being made of a polymer material; and
   electrodes being respectively provided on both faces of said sheet member, said electrodes being mainly made of carbon nano fibers,
   wherein the carbon nano fibers of said electrodes rise with respect to said sheet member, and
   one end of the carbon nano fibers bite into said sheet member.

2. The actuator according to claim 1, wherein the polymer material is polyurethane resin.

3. The actuator according to claim 1, wherein the polymer material is silicone resin.

4. The actuator according to claim 1, wherein an electrolyte is doped in the polymer material.

5. The actuator according to claim 4, wherein the electrolyte is sodium acetate.

6. The actuator according to claim 1, wherein graphite or carbon is added to the carbon nano fibers.

7. The actuator according to claim 1, wherein the carbon nano fibers are formed using vapor growth.

8. A method of manufacturing an actuator, which has a flexible sheet member made of a polymer material and electrodes which are mainly made of carbon nano fibers respectively provided on both faces of the sheet member, comprising:
   forming two sub-sheet members, in each if which said electrodes is formed on an outer face; and
   mutually adhering inner faces of the sub-sheet members,
   wherein the carbon nano fibers of said electrodes rise with respect to said sheet member, and one end of the carbon nano fibers bite into said sheet member.

9. The method according to claim 8, wherein the polymer material is polyurethane resin.

10. The method according to claim 8, wherein the polymer material is silicone resin.

11. The method according to claim 8, wherein an electrolyte is doped in the polymer material.

12. The method according to claim 11, wherein the electrolyte is sodium acetate.

13. The method according to claim 8, wherein graphite or carbon is added to the carbon nano fibers.

14. The method according to claim 8, wherein the carbon nano fibers are formed using vapor growth.

* * * * *